United States Patent
Baldi

(10) Patent No.: US 6,350,676 B1
(45) Date of Patent: Feb. 26, 2002

(54) METHOD OF FORMING HIGH-STABILITY METALLIC CONTACTS IN AN INTEGRATED CIRCUIT WITH ONE OR MORE METALLIZED LAYERS

(75) Inventor: Livio Baldi, Agrate Brianza (IT)

(73) Assignee: SGS-Thomson Microelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 08/411,385

(22) Filed: Mar. 28, 1995

Related U.S. Application Data

(63) Continuation of application No. 07/980,550, filed on Nov. 23, 1992, now abandoned.

(30) Foreign Application Priority Data

Nov. 22, 1991 (IT) .......................................... MI91A3121

(51) Int. Cl.[7] .......................................... H01L 21/4763
(52) U.S. Cl. ...................................................... 438/629
(58) Field of Search ................................ 257/763, 765; 156/656; 437/190, 195, 192, 194; 438/629, 656, 672, 688

(56) References Cited

U.S. PATENT DOCUMENTS

| | | | |
|---|---|---|---|
| 4,107,726 A | | 8/1978 | Schilling |
| 4,392,298 A | | 7/1983 | Barker et al. |
| 4,520,041 A | | 5/1985 | Aoyama et al. |
| 4,544,445 A | | 10/1985 | Jeuch et al. |
| 4,592,802 A | | 6/1986 | Deleonibus et al. |
| 4,677,739 A | * | 7/1987 | Doering et al. ............... 437/26 |
| 4,960,732 A | * | 10/1990 | Dixit et al. .................. 437/192 |
| 4,962,414 A | | 10/1990 | Liou et al. |
| 4,994,410 A | * | 2/1991 | Sun et al. .................... 437/192 |
| 5,006,916 A | * | 4/1991 | Wills ............................. 257/751 |
| 5,036,382 A | * | 7/1991 | Yamaha ....................... 257/765 |
| 5,108,951 A | | 4/1992 | Chen et al. |
| 5,117,276 A | * | 5/1992 | Thomas et al. ............. 156/656 |

FOREIGN PATENT DOCUMENTS

| | | |
|---|---|---|
| EP | 0068897 | 1/1983 |
| EP | 0070737 | 1/1983 |
| EP | 0 376 709 A2 | 7/1990 |
| JP | 56-69843 | 6/1981 |
| JP | 56-130920 | 10/1981 |

OTHER PUBLICATIONS

Wolf, Silicon Processing, vol. II, 1990, Lattice Press, pp. 240–252.*
Patent Abstracts of Japan, vol. 011, No. 249 (E–532) Aug. 13, 1987.
Processings 2nd Internat'l IEEE VLSI 1, 7, Multilevel Intercon. Conf. 26, Jun. 1985: G.C. Smith, "CVD Tungsten Contact Plugs by in Situ Deposition and Etchback" (p. 350, ¶3).
Matsuoka et al., "Electromigration reliability for a tungsten-filled via hole structure," 37 IEEE Transactions on Electron Devices 562–568 (Mar. 1990).
Lee et al., "Chemical vapor deposition of tungsten (CVD W) as submicron interconnection and via stud," 1989 Journal of the Electrochemical Society pp 2108–2112 (1989).

(List continued on next page.)

Primary Examiner—T. N. Quach
(74) Attorney, Agent, or Firm—Jenkens & Gilchrist, P.C.

(57) ABSTRACT

A method of forming high-stability metallic contacts in an integrated circuit with one or more metallized layers wherein, after a preliminary step of providing contact holes in a layer of dielectric material: a prebarrier layer of Ti or TiN is formed overall; a layer of tungsten is formed by chemical vapor deposition so as to coat the bases and the walls of the contact holes uniformly; aluminum or an alloy thereof is sputter-deposited, under high-temperature low-flux conditions, to fill the contact holes; and patterning the aluminum and tungsten layers to form metallic interconnections of predetermined geometry.

24 Claims, 3 Drawing Sheets

OTHER PUBLICATIONS

Sun et al., "Al/W/TiN$_x$/TiSi$_y$/Si Barrier Technoloty for 1.0–$\mu$m Contacts," 9 IEEE Electron Device Letters pp 71–73 (Feb. 1988).

Hara et al., "Barrier effect of W–Ti Interlayers in Al Ohmic Contact SYstem," 34 IEEE Transactions on Electron Devices p 593–598 (Mar. 1987).

Peng et al., A Manufacturable 2.0 Micron Pitch Three–Level–Metal Interconnect Process for High Performance 0.8 Micron CMOS Technology 1990 Symposium of VLSI Technology, p. 25–26.

Wei et al., "The Use of Selective Silicide Plugs for Submicron Contact Fill" Jun. 12–13, 1989 VMIC Conference, p 136–143.

Laarhoven et al., "A Novel Blanket Tungsten Etchback Scheme", Jun. 12–13, 1989 VMIC Conference, p. 129–135.

Piekaar et al., LPCVD of Aluminium in a Batch–type Load–locked Multi–Chamber Processing System Jun. 12–13, 1989 VMIC Conference, p. 122–128.

Clark et al., "Integrated Deposition and Etchback of Tungsten in a Multi–Chamber, Single–Wafer System", Jun. 12–13, 1990 VMIC Conference, p. 478–480.

Shenasa et al., "An Optimized High Pressure Tungsten Process for VLSI Interconnect and Plug Applications" Jun. 12–13, 1990 VMIC Conference, p. 322–324.

Manos et al., "A Submicron Triple–Level–Metal Gate Array Process Utilizing Tungsten for 1st Level Interconnect", Jun 12–13, 1990 VMIC Conference, p. 40–46.

Ono et al., "Development of a Planarized Al–Si Contact Filling Technology", Jun. 12–13, 1990 VMIC Conference, p. 76–82.

Kim et al., TiN Production and Performance as a Barrier Layer in ULSI Technology:, Jun. 12–13, 1990 VMIC Conference, p. 459–461.

Wolf, "Silicon Processing for the VLSI Era—vol. 2", p 240–253.

* cited by examiner

METHOD OF FORMING HIGH-STABILITY METALLIC CONTACTS IN AN INTEGRATED CIRCUIT WITH ONE OR MORE METALLIZED LAYERS

This is a continuation of application Ser. No. 07/980,550, filed Nov. 23, 1992, abandoned.

CROSS-REFERENCE TO RELATED APPLICATION

This application claims priority from Italian Application MI91A003121, filed Nov. 22, 1991, which is hereby incorporated by reference.

BACKGROUND AND SUMMARY OF THE INVENTION

The present invention relates to a method of forming high-stability metallic contacts in an integrated circuit with one or more metallized layers, of the type including the preliminary step of providing a plurality contact holes in a layer of dielectric material, the holes having opposite ends which open substantially flush with the layer and in an intermediate region of the circuit, respectively.

More particularly, the present invention relates to a method of producing very stable and reliable metal contacts of micrometric or submicrometric dimensions in integrated circuits with high or very high levels of integration.

As is known, the structure of an integrated circuit comprises a plurality of active and passive circuit components and metallic interconnecting layers which are insulated from each other by layers of dielectric material.

Apertures or holes formed in the dielectric layers enable the various components and the various interconnecting layers to be connected to each other.

The holes are known as "contacts" when they enable connections to be formed between metallic interconnections and circuit components or as "vias" when they connect several interconnecting layers.

In the field of integrated circuits, the aim is always to increase the so-called "scale of integration", that is, to form circuit components of ever smaller dimensions.

However, vertical scaling is limited because the thicknesses of the layers of dielectric material cannot fall below a minimum value without causing an increase in the parasitic capacitances between the interconnecting layers, and hence a decline in the signal-processing speed of the circuit.

If the dimensions of the contacts, meaning the widths of the holes formed in the layers of dielectric material, are reduced, there is consequently no corresponding proportional reduction in their thicknesses.

The metal contacts of very large-scale integration (VLSI) circuits are therefore distinguished by a depth/aperture ratio greater than unity.

Because of this structural characteristic of VLSI integrated circuits, the deposition, normally by the so-called "sputtering" technique, of a uniform layer of conductive metal, for example, aluminium, on the internal walls of the holes formed in the dielectric is extremely difficult.

More particularly, the layer of aluminium deposited becomes very thin at the edges between the bottoms and the side walls of the holes, causing serious problems as regards the reliability of the circuit in operation, due to the so-called electromigration phenomenon.

In order to ensure that the thickness of the conductive layer within the contact is sufficiently uniform, the use of so-called "planarizing" deposition methods, that is methods which can form a layer of conductive metal such as to cover all the steps present in the surface of the circuit, has been proposed.

A first technique for depositing these layers, which are known as "planarized metallizations", involves the deposition of aluminium by sputtering at a temperature above 400° C. and at a slow deposition rate.

Under these conditions, the aluminium is brought to an almost fluid state and fills the holes and planarizes all the steps present in the surface of the circuit which has a substantially flat surface upon completion of the deposition.

However, this technique has a series of disadvantages which are not easy to eliminate, the main disadvantage being the fact that, at the sputtering temperature, the aluminium tends to react chemically with the silicon of the junctions in the bases of the contact holes, dissolving it and creating metallic protuberances within the silicon, which are known in the field by the term "spikes" and which tend to short-circuit the junctions.

In the case of circuits with several metallized layers, the problem is further aggravated because of the repeated heating cycles which are carried out during the deposition of the various layers of aluminium.

In the case of circuits with several metallized layers, it has therefore been proposed to replace the aluminium with tungsten in the first metallized layer.

This is deposited by chemical vapour deposition (CVD).

Although this technique enables optimal coverage of the steps, it cannot be applied to circuits with only one metallized layer because of the high resistivity of tungsten and, precisely because of this high resistivity, generally involves serious limitations on signal-processing speeds, even for circuits with several metallized layers.

As a result, the problem of obtaining a good electrical performance, meaning the ratio between the number of circuits which operate correctly from an electrical point of view and the total number or circuits produced, and, in particular, of obtaining acceptable reliability values from integrated circuits with very large-scale integration has not hitherto been resolved in a completely satisfactory manner.

The technical problem upon which the present invention is based is therefore that of providing a method which enables high-stability metallic contacts to be formed in an integrated circuit with one or more metallized layers, and which does not have the disadvantages complained of with reference to the prior art mentioned.

According to the invention, this problem is solved by a method of the type indicated above which is characterised in that it includes the steps of:

a) forming a first layer of tungsten on the substrate of dielectric material by chemical vapour deposition so as to cover the bases and the walls of the contact holes uniformly, b) forming a second layer of aluminium or an alloy thereof by "sputtering" deposition on top of the first layer of tungsten so as to fill the holes, and c) forming a plurality of metallic interconnections of predetermined geometry by the selective removal of predetermined areas of the superposed aluminium and tungsten layers.

BRIEF DESCRIPTION OF THE DRAWING

The present invention will be described with reference to the accompanying drawings, which show important sample embodiments of the invention and which are incorporated in the specification hereof by reference, wherein.

Further characteristics and the advantages of the invention will become clearer from the following detailed description of an embodiment thereof, given by way of non-limiting indication with reference to the appended drawings. In the drawings.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

With reference to the drawings, an integrated circuit shown at an intermediate stage of manufacture, after the so-called "opening of the contacts" is generally indicated 1.

Figure 1:
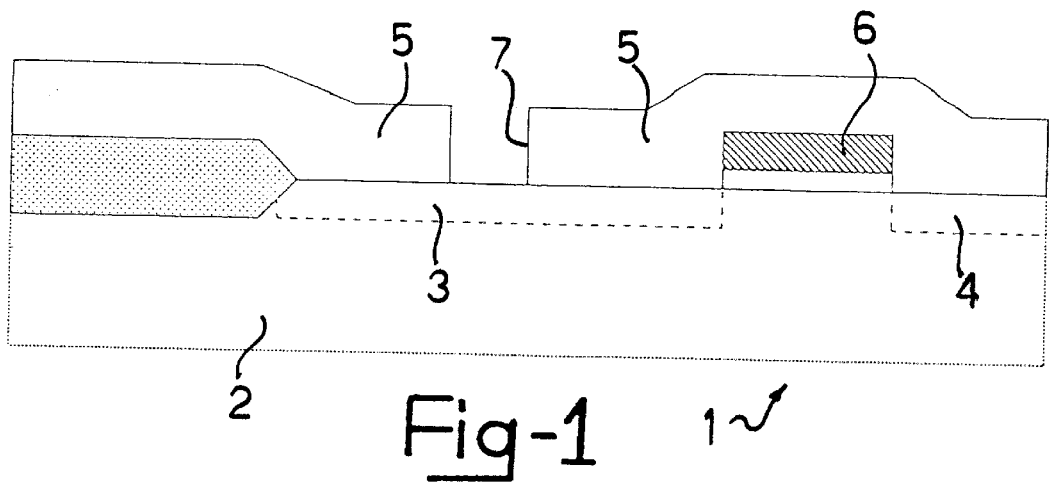
FIGS. 1 to 6 show schematically successive steps of a first embodiment of the method of the invention.
Figure 2:
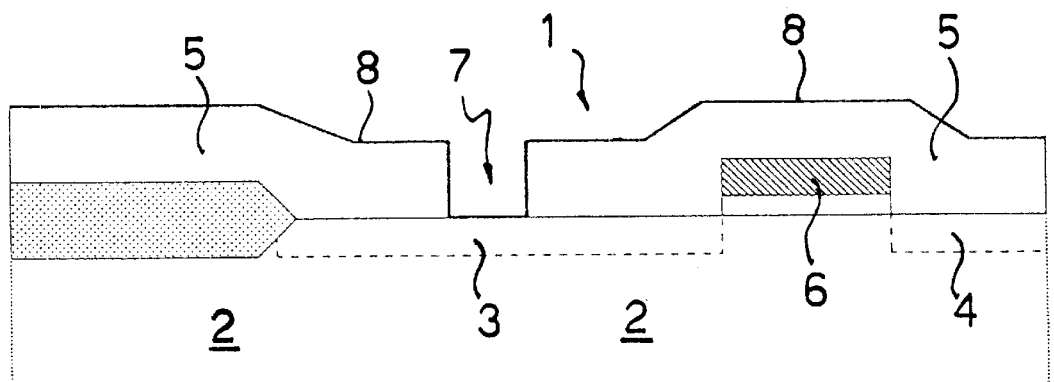
Figure 3:
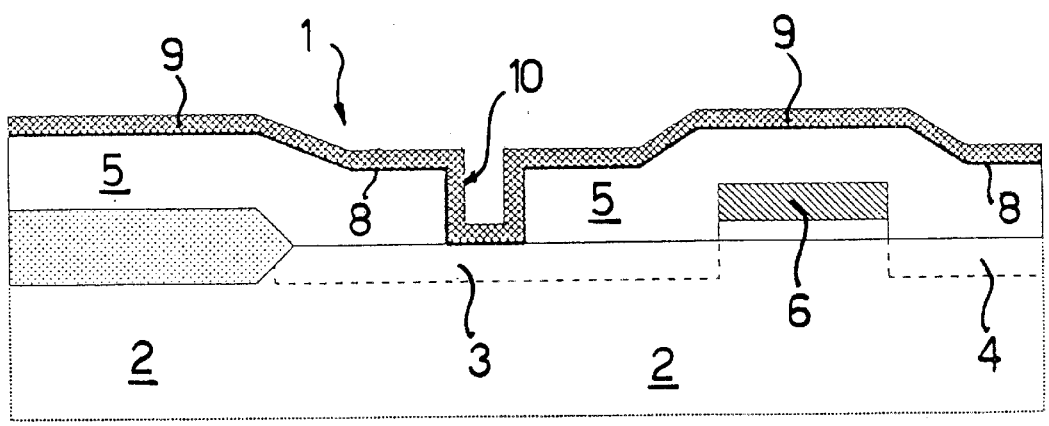
Figure 4:
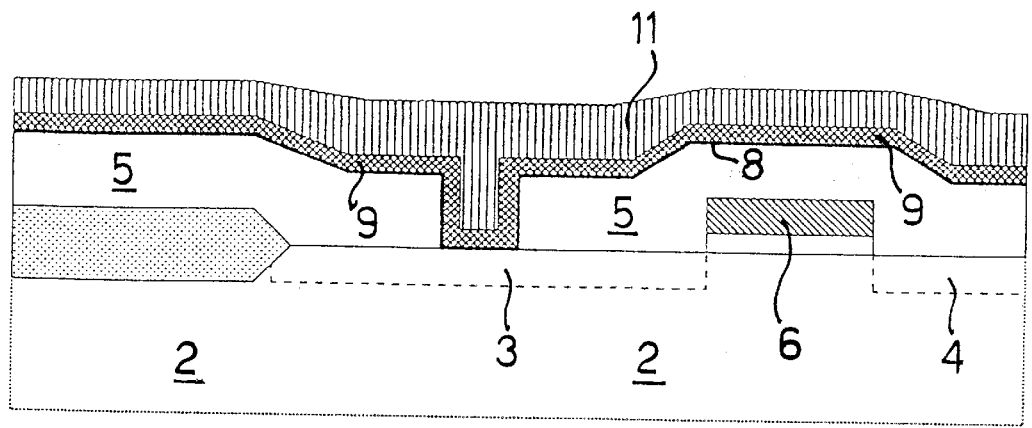
Figure 5:
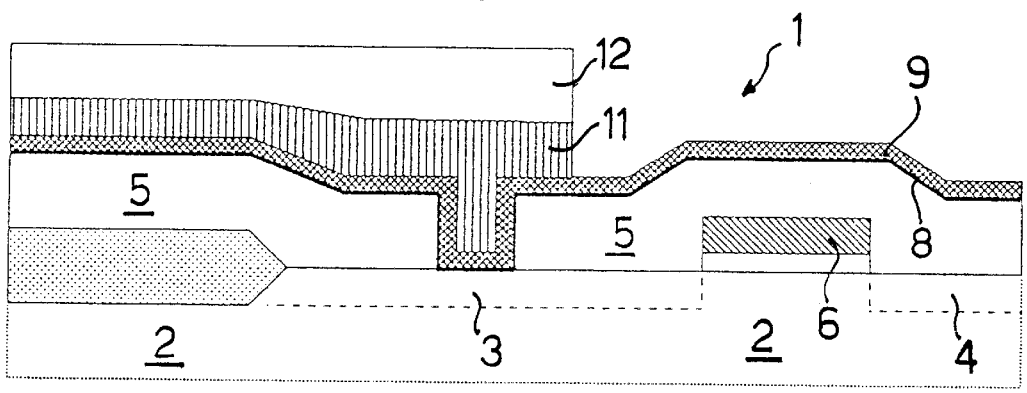

As is clear from FIG. 1, at this stage of its manufacture, the integrated circuit 1 includes a substrate 2 of doped monocrystalline silicon of a first type, within which are defined regions 3, 4 of doped silicon of a second type, intended to constitute, for example, an emitter (source) and a collector (drain) of the circuit being produced.

A layer of insulating dielectric material, for example, silicon oxide, indicated 5, incorporates portions 6 of doped polycrystalline silicon, constituting the so-called gate paths.

A plurality of holes 7 formed in the layer 5 of dielectric material have opposite ends which open substantially flush with the layer 5 and in the doped regions 3 of the second type, respectively.

According to the method of the invention, an adhesion or prebarrier layer 8 is deposited on the integrated circuit 1 and comprises a metallic material selected from the group including alloys of titanium, alloys of tungsten and titanium, titanium nitride or multilayered structures of these metallic materials deposited one upon another. The layer 8 preferably comprises a first layer of titanium about 50 nm thick on which a second layer of titanium nitride is deposited with a total thickness which may vary between 50 and 90 nm.

A layer 9 of tungsten is then deposited on the prebarrier layer 8 by chemical vapour deposition (CVD), for example, from a mixture of $WF_6$ and $H_2$ or $SiH_4$, so as uniformly to cover the substrate 5 of dielectric material and the side walls and the bases of the holes 7.

A plurality of second holes 10 extending within the holes 7 and coaxial therewith is thus defined in the integrated circuit 1 which is being produced.

The tungsten layer 9 is formed by chemical vapour deposition carried out at a temperature which may vary between 450 and 480° C. and at pressures which may vary between 50 and 100 torrs from a mixture of tungsten fluoride, hydrogen and silane, to produce a layer of the order of 150–200 nm thick.

According to the present invention, the layer 9 is formed, using apparatuses conventional in the art, at a deposition rate at from 180 to 220 nm/mmn and preferably of 200 nm/mm.

In a subsequent step of the-method according to the invention, a layer 11 of aluminium or an alloy thereof, for example an Al/Si/Cu alloy, is deposited by socalled planarising sputtering deposition.

In accordance with a further aspect of the present invention, it has been observed that an aluminium-based layer accomplishing an effective planarization of the outer surface of circuit 1 may be obtained when the sputtering deposition is carried out at a temperature of from 400 to 450° C. and at a deposition rate of from 120 to 180 nm/mmn.

Preferably, the deposition is carried out at 420° C. with a deposition rate of 150 nm/min. The layer 11 thus produced is such as to fill the holes 10 completely and reaches a thickness of about 0.6–0.8 microns on top of the tungsten layer 9 previously deposited.

Upon completion of this step, the integrated circuit 1 will have a substantially flat outer surface.

A film 12 of a polymeric material is then deposited on predetermined areas of the integrated circuit 1 to form a mask of predetermined geometry which enables the selective removal of the layers of aluminium and tungsten by known etching techniques known as R.I.E. (reactive ion etching) techniques.

More particularly, the removal of the superposed layers 11 and 9 of aluminium and tungsten takes place in two successive steps.

In a first step, the aluminium layer 11 is removed selectively, for example, by etching by means of a plasma generated by a mixture of $BCl_3$, $Cl_2$ and $CHCl_3$, at a wafer temperature of about 60–80° C.

Advantageously, this type of etching is highly selective to the tungsten. In other words, it cannot remove the tungsten layer which consequently behaves as an etch stop, ensuring complete removal of the aluminium from the regions which are not protected by the film 12.

The tungsten is then selectively removed, again by R.I.E. etching but by a fluorinated mixture of $SF_6$ and $CBrF_3$ or $SF_6$ and $O_2$, without removing the film 12 and, preferably, with the wafer being cooled so that a temperature of 20–25° C. is not exceeded.

Finally, the prebarrier layer 8 is removed by conventional methods.

Thus, for example, if the layer 8 is formed by superposed layers of Ti and TiN, etching may be carried out by means of a plasma generated by a mixture of chlorides with the use of methods similar to those for removing the aluminium layer 11.

If the film 12 of polymeric material has not been removed during the preceding steps, the method of the present invention provides for its removal by one of the usual etching methods known in the art.

Figure 6:
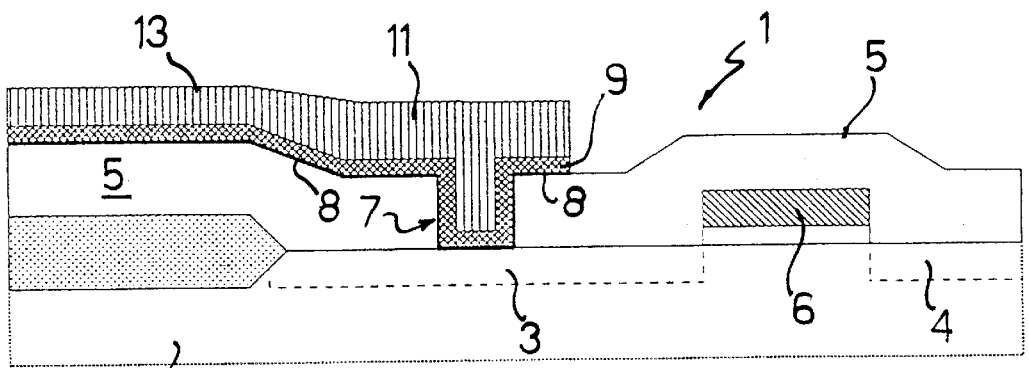
Figure 7:
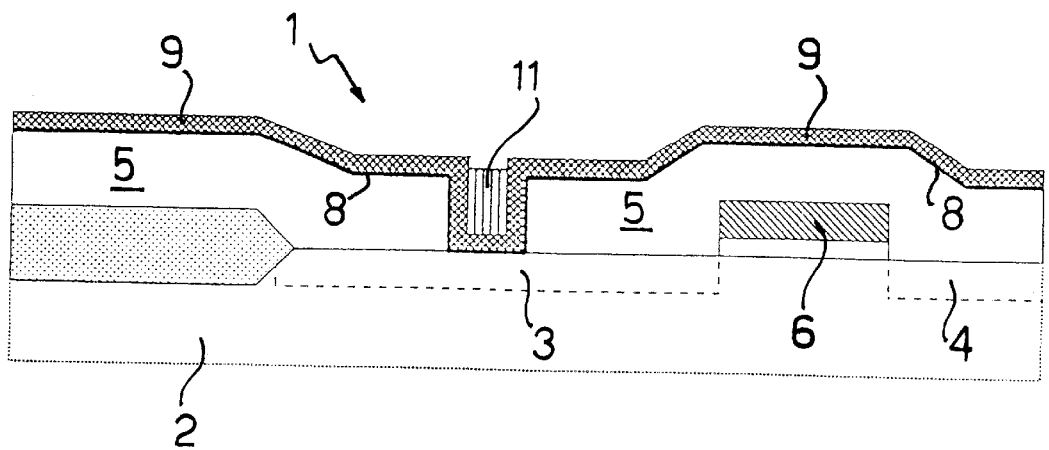
FIGS. 7 and 8 show schematically some steps of a second embodiment of the method of the invention.

Upon completion of the aforementioned steps, the integrated circuit 1 will have the structure shown schematically in FIG. 6.

A plurality of metallic interconnections 13 of predetermined geometry are defined on the circuit 1 for interconnecting the various circuit components, for example, for connecting the doped region 3 of the second type,.which constitutes an emitter (source), to other portions of the circuit.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

As will be recognized by those skilled in the art, the innovative concepts described in the present application can be modified and varied over a tremendous range of applications, and accordingly the scope of patented subject matter is not limited by any of the specific exemplary teachings given.

Figure 8:
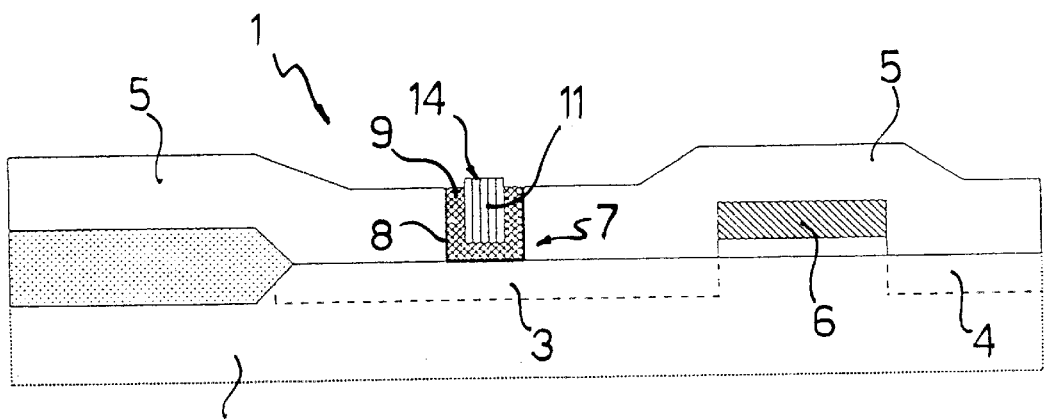

According to a second embodiment of the present invention, metallic contacts in the form of plugs, indicated 14 in FIG. 8, may be formed by removing the layers 11 and 9 of aluminium and tungsten in the following manner.

The aluminium layer 11 is removed entirely, again with the use of R.I.E. etching.

Upon completion of this step, there will be a slight over-etching of the aluminium layer 11, in other words, the aluminium 11 will be slightly recessed in the holes 10.

During a subsequent step, the tungsten layer 9 deposited on the sides of the holes 7 is removed selectively, again with the use of known R.I.E. etching methods as indicated above.

A contact in the form of a plug 14 comprising superposed layers of aluminium and tungsten is thus produced in each of the holes 7 formed in the substrate 5 of dielectric material.

A layer of aluminium or an alloy thereof, with a thickness of 0.6–1.0 microns and having a predetermined geometry, is then deposited by known methods.

The integrated circuit 1 incorporating the interconnections 13 or the plugs 14 is then sent for subsequent known processes for masking, for the formation of further metallized layers, etc.

The method of the present invention has provided good results in the production of MOS, CMOS and bipolar integrated circuits with two or more metallized layers and having contact dimensions equal to or less than one micron.

The method of the present invention enables the following advantages to be achieved in comparison with the methods of the prior art:

good ohmic contact between the various metallized layers and/or with the regions formed in the silicon substrate 2 is ensured by characteristics which can be reproduced circuit by circuit, there is no damage to the junctions between the metallic contacts and the regions in the silicon substrate as a result of the deposition of aluminium at a high temperature, by virtue of the presence of the tungsten layer 9 which performs a protective function, the planarizing layer of aluminium can be deposited more easily by virtue of the presence of the tungsten layer 9 which ensures the presence of a uniform and clean surface, low specific resistivity of the interconnections is ensured by the coating of the tungsten with aluminium, which is a metal with a lower resistivity.

I claim:

1. A method of forming high-stability metallic contacts in an integrated circuit with one or more metallized layers, including the preliminary step of providing a plurality of contact holes in a layer of dielectric material, the holes having opposite ends which open approximately flush with the layer and in an intermediate region of the circuit respectively, comprising the steps of:

a) conformally depositing overall at least one prebarrier layer of a metallic material selected from the group consisting of titanium and alloys thereof and titanium nitride;

b) forming a first layer of tungsten by chemical vapor deposition so as to coat all surfaces of the contact holes uniformly without filling the contact holes, c) forming a second layer consisting predominantly of aluminum by sputter deposition, under planarizing conditions, on top of said first layer so as to fill the holes, and d) forming a plurality of metallic interconnections of desired geometry by a selective removal of desired areas of the superposed aluminum and tungsten layers.

2. A method according to claim 1, wherein said step of forming said second layer is carried out at a temperature of between 400 and 450° C. and at a deposition rate of from 120 to 180 nm/min.

3. A method according to claim 1, wherein said prebarrier layer is between 50 and 90 nm thick.

4. A method according to claim 1, wherein said first layer is between 150 and 200 nm thick.

5. A method according to claim 1, wherein said second layer is between 0.6 and 0.8 microns thick.

6. A method according to claim 1, wherein said step of selective removal of said superposed aluminum and tungsten layers is carried out by patterned selective reactive ion etching.

7. A method according to claim 1, wherein said step of forming a plurality of metallic interconnections is effected by:

selectively removing said second layer, except for portions thereof which are within the contact holes, and selectively removing said first, layer to produce a plug including superposed layers of tungsten and aluminum in each hole.

8. The method of claim 1, wherein said second layer consists essentially of aluminum alloyed with silicon and copper.

9. The method of claim 1, wherein said second layer comprises copper.

10. A method of forming contact structures in an integrated circuit, comprising the steps of:

(a) providing an integrated circuit structure including at least one hole, through which contact is sought to be made, in a dielectric material;

(b) depositing a prebarrier material, consisting of a layered structure of titanium and titanium nitride, at the bottom of said hole;

(c) conformally depositing a first layer, consisting essentially of tungsten, from a gaseous mixture without filling said hole;

(d) sputter-depositing a second layer, consisting predominantly of aluminum, at a temperature high enough to provide planarization and void-filling, to completely fill and planarize said holes;

(e) forming a patterned resist material over said second layer, to expose portions of said second layer which are not part of a desired interconnect pattern;

(f) removing said second layer, where exposed by said resist material, by anisotropic etching using a first chemistry;

(g) removing said first layer, where exposed by said second layer, by anisotropic etching using a second chemistry which is different from said first chemistry; and (h) removing said prebarrier layer, where exposed by said first layer.

11. The method of claim 10, wherein said second layer consists essentially of aluminum alloyed with silicon and copper.

12. The method of claim 10, wherein said prebarrier layer is between 50 and 90 nm thick.

13. The method of claim 10, wherein said first layer is between 150 and 200 nm thick.

14. The method of claim 10, wherein said second layer is between 0.6 and 0.8 microns thick.

15. A method of forming contact structures in an integrated circuit, comprising the steps of:

(a) providing an integrated circuit structure including at least one hole, through which contact is sought to be made, in a dielectric material;

(b) depositing a prebarrier material, consisting of a layered structure of titanium and titanium nitride, at the bottom of said hole;

(c) conformally depositing a first layer, consisting essentially of tungsten, from a gaseous mixture, without filling said hole;

(d) sputter-depositing a second layer, consisting predominantly of aluminum, at a temperature between 400 and 450° C. and at a deposition rate between 120 and 180 nm/min, to completely fill and planarize said holes;

(e) forming a patterned resist material over said second layer, to expose portions of said second layer which are not part of a desired interconnect pattern;

(f) removing said second layer, where exposed by said resist material, by anisotropic etching using a first chemistry;

(g) removing said first layer, where exposed by said second layer, by anisotropic etching using a second chemistry which is different from said first chemistry; and (h) removing said prebarrier layer, where exposed by said first layer.

16. The method of claim 15, wherein said second layer consists essentially of aluminum alloyed with silicon and copper.

17. The method of claim 15, wherein said prebarrier layer is between 50 and 90 nm thick.

18. The method of claim 15, wherein said first layer is between 150 and 200 nm thick.

19. The method of claim 15, wherein said second layer is between 0.6 and 0.8 microns thick.

20. A method of forming contact structures in an integrated circuit, comprising the steps of:

(a) providing an integrated circuit structure including at least one hole, through which contact is sought to be made, in a dielectric material;

(b) depositing a prebarrier material, consisting of a layered structure of titanium and titanium nitride, at the bottom of said hole;

(c) conformally depositing a first layer, consisting essentially of tungsten, from a gaseous mixture, said first layer having a maximum thickness of approximately 200 nm, and wherein said first layer does not fill said hole;

(d) sputter-depositing a second layer, consisting predominantly of aluminum, at a temperature high enough to provide planarization and void-filling, to completely fill and planarize said holes;

(e) forming a patterned resist material over said second layer, to expose portions of said second layer which are not part of a desired interconnect pattern;

(f) removing said second layer, where exposed by said resist material, by anisotropic etching using a first chemistry;

(g) removing said first layer, where exposed by said second layer, by anisotropic etching using a second chemistry which is different from said first chemistry; and (h) removing said prebarrier layer, where exposed by said first layer.

21. The method of claim 20, wherein said second layer consists essentially of aluminum alloyed with silicon and copper.

22. The method of claim 20, wherein said prebarrier layer is between 50 and 90 nm thick.

23. The method of claim 20, wherein said first layer is between 150 and 200 nm thick.

24. The method of claim 20, wherein said second layer is between 0.6 and 0.8 microns thick.

* * * * *

UNITED STATES PATENT AND TRADEMARK OFFICE
CERTIFICATE OF CORRECTION

PATENT NO. : 6,350,676 B1
DATED : February 26, 2002
INVENTOR(S) : Livio Baldi

It is certified that error appears in the above-identified patent and that said Letters Patent is hereby corrected as shown below:

Column 1,
Line 21, after "plurality" insert -- of --

Column 3,
Line 67, replace "nm/mmn" with -- nm/min --
Line 67, replace "nm/mm" with -- nm/min --

Column 4,
Line 1, replace "the-method" with -- the method --
Line 10, replace "nm/mmn." with -- nm/min --
Line 61, replace "type,." with -- type, --

Signed and Sealed this

Twenty-sixth Day of August, 2003

JAMES E. ROGAN
*Director of the United States Patent and Trademark Office*